(12) United States Patent
Mallikarjunaswamy

(10) Patent No.: US 11,664,368 B2
(45) Date of Patent: *May 30, 2023

(54) LOW CAPACITANCE TRANSIENT VOLTAGE SUPPRESSOR INCLUDING A PUNCH-THROUGH SILICON CONTROLLED RECTIFIER AS LOW-SIDE STEERING DIODE

(71) Applicant: Alpha and Omega Semiconductor (Cayman) Ltd., Grand Cayman (KY)

(72) Inventor: Shekar Mallikarjunaswamy, San Jose, CA (US)

(73) Assignee: Alpha & Omega Semiconductor (Cayman) Ltd., Grand Cayman (KY)

( * ) Notice: Subject to any disclaimer, the term of this patent is extended or adjusted under 35 U.S.C. 154(b) by 314 days.

This patent is subject to a terminal disclaimer.

(21) Appl. No.: 17/032,900

(22) Filed: Sep. 25, 2020

(65) Prior Publication Data

US 2021/0013192 A1 Jan. 14, 2021

Related U.S. Application Data

(63) Continuation of application No. 16/172,314, filed on Oct. 26, 2018, now Pat. No. 10,825,805.

(51) Int. Cl.
  *H01L 27/02* (2006.01)
  *H01L 29/66* (2006.01)
  *H01L 27/08* (2006.01)
  *H01L 29/861* (2006.01)

(52) U.S. Cl.
  CPC ...... *H01L 27/0255* (2013.01); *H01L 27/0262* (2013.01); *H01L 27/0814* (2013.01); *H01L 29/66098* (2013.01); *H01L 29/861* (2013.01)

(58) Field of Classification Search
  None
  See application file for complete search history.

(56) References Cited

U.S. PATENT DOCUMENTS

| | | | |
|---|---|---|---|
| 6,586,317 B1 * | 7/2003 | Vashchenko | H01L 21/82285 257/E21.612 |
| 6,610,262 B1 * | 8/2003 | Peng | H01L 27/0262 257/355 |
| 8,338,854 B2 | 12/2012 | Bobde et al. | |
| 8,461,644 B2 | 6/2013 | Bobde et al. | |
| 8,742,455 B2 | 6/2014 | Coyne | |
| 8,816,389 B2 | 8/2014 | Coyne | |
| 10,825,805 B2 * | 11/2020 | Mallikarjunaswamy | H01L 27/0262 |

(Continued)

*Primary Examiner* — Bilkis Jahan

(57) ABSTRACT

A transient voltage suppressor (TVS) device uses a punch-through silicon controlled rectifier (SCR) structure for the low-side steering diode where the punch-through SCR structure realizes low capacitance at the protected node. In some embodiments, the punch-through silicon controlled rectifier of the low-side steering diode includes a first doped region formed in a first epitaxial layer, a first well formed spaced apart from the first doped region where the first well is not biased to any electrical potential, and a second doped region formed in the first well. The first doped region, the first epitaxial layer, the first well and the second doped region form the punch-through silicon controlled rectifier, with the first doped region forming the anode and the second doped region forming the cathode of the punch-through silicon controlled rectifier.

20 Claims, 11 Drawing Sheets

(56) References Cited

U.S. PATENT DOCUMENTS

| | | | |
|---|---|---|---|
| 2007/0073807 A1* | 3/2007 | Bobde | H01L 29/407 257/E29.066 |
| 2009/0115018 A1* | 5/2009 | Mallikarjunaswamy | H01L 21/84 257/E21.608 |
| 2009/0237847 A1* | 9/2009 | Ryu | H01L 27/0262 361/56 |
| 2010/0181643 A1 | 7/2010 | Kothandaraman et al. | |
| 2014/0167101 A1 | 6/2014 | Bobde et al. | |

* cited by examiner

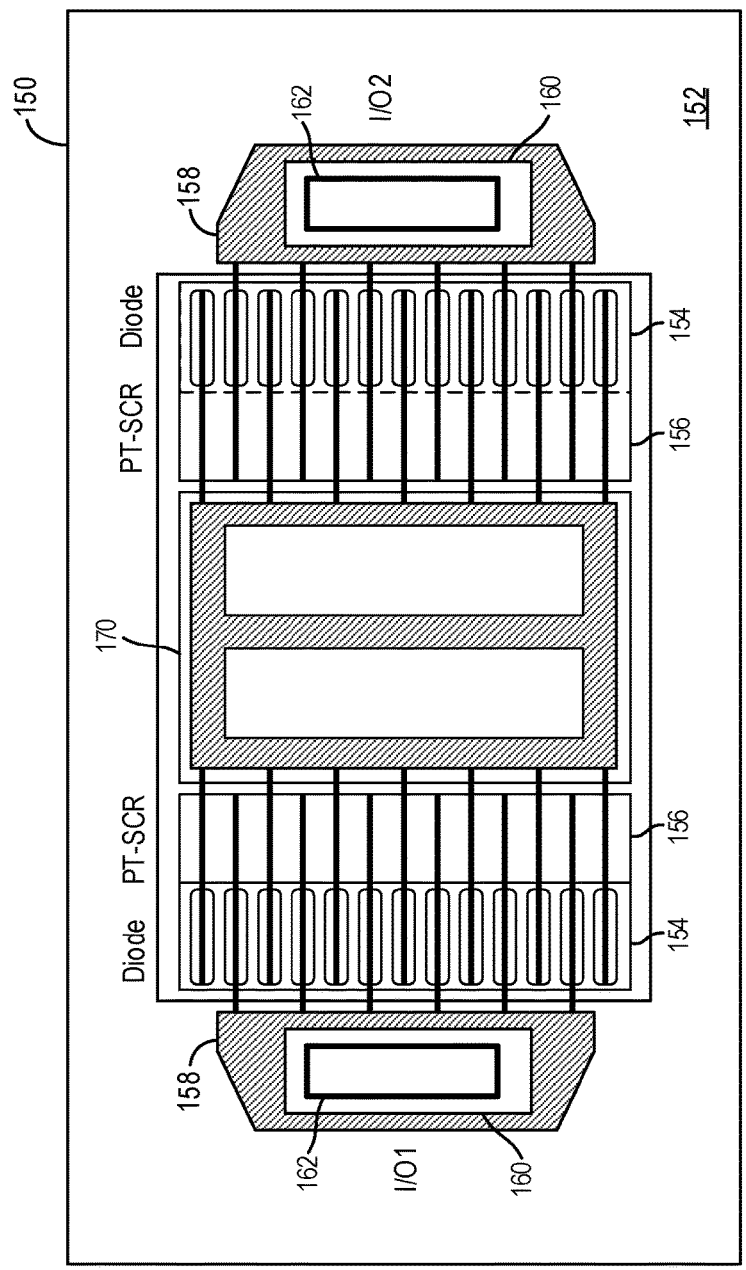
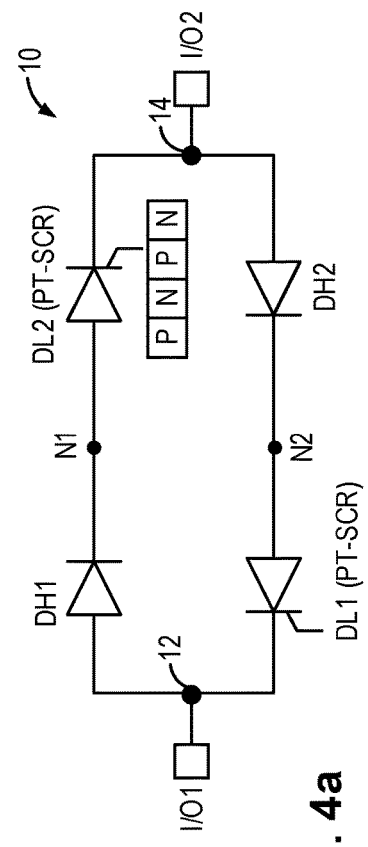
Fig. 4
Fig. 4a

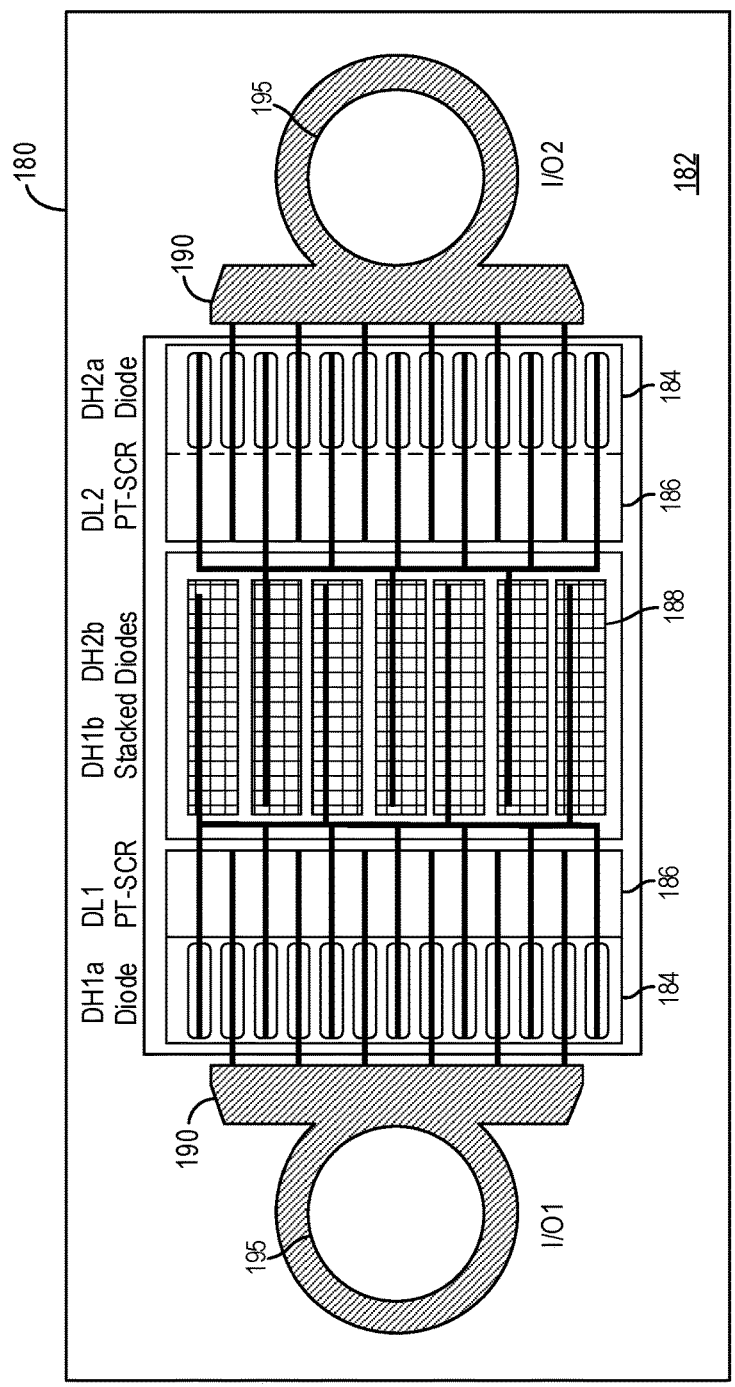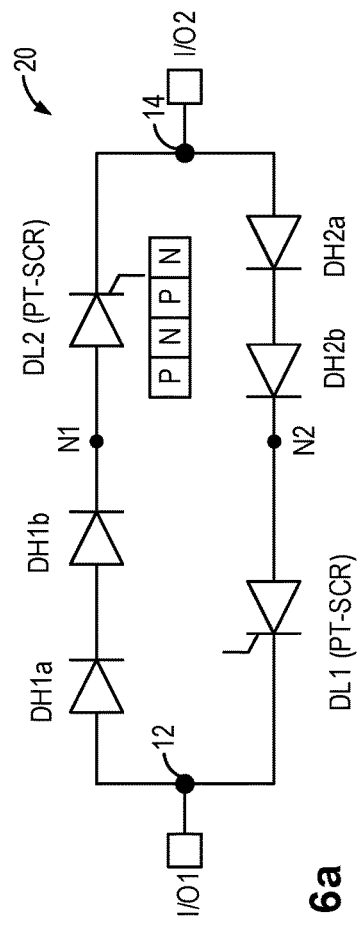
Fig. 6
Fig. 6a

LOW CAPACITANCE TRANSIENT VOLTAGE SUPPRESSOR INCLUDING A PUNCH-THROUGH SILICON CONTROLLED RECTIFIER AS LOW-SIDE STEERING DIODE

CROSS REFERENCE TO OTHER APPLICATIONS

This application is a continuation of U.S. patent application Ser. No. 16/172,314, entitled LOW CAPACITANCE TRANSIENT VOLTAGE SUPPRESSOR INCLUDING A PUNCH-THROUGH SILICON CONTROLLED RECTIFIER AS LOW-SIDE STEERING DIODE, filed Oct. 26, 2018, now U.S. Pat. No. 10,825,805, issued Nov. 3, 2020, which is incorporated herein by reference for all purposes.

BACKGROUND OF THE INVENTION

Voltage and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins need high surge protection but can tolerate protection devices with higher capacitance. Meanwhile, the data pins, which may operate at high data speed, requires protection devices that provide surge protection with low capacitance so as not to interfere with the data speed of the protected data pins.

Existing TVS protection solution applied to input/output (I/O) terminals in high speed applications exist both in vertical and lateral type of semiconductor circuit structures. In the unidirectional TVS, the I/O current during an ESD event flows through a low capacitance high side steering diode into a large reverse blocking junction or the current flows through the low capacitance low side steering diode to ground. In the case of bidirectional TVS protection, low capacitance is achieved by connecting a low capacitance forward biased diode in series with a large reversed biased junction for blocking. For high speed applications, there is a need to lower the breakdown voltage, the capacitance and the clamping voltage of TVS protection devices.

BRIEF DESCRIPTION OF THE DRAWINGS

Various embodiments of the invention are disclosed in the following detailed description and the accompanying drawings.

FIG. 4, which includes FIG. 4a, is a top view of a TVS protection device in embodiments of the present invention.

FIG. 6, which includes FIG. 6a, is a top view of a TVS protection device in alternate embodiments of the present invention.

DETAILED DESCRIPTION

Figure 1:
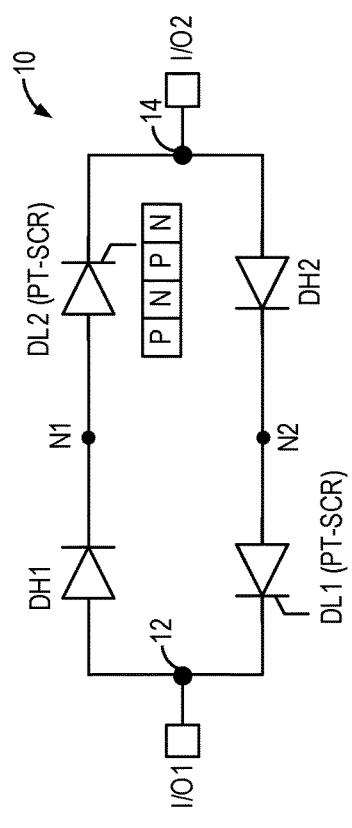
FIG. 1 is a circuit diagram of a bidirectional TVS protection device in embodiments of the present invention.

In embodiments of the present invention, a low capacitance transient voltage suppressor (TVS) device uses a punch-through silicon controlled rectifier (SCR) structure for the high-side steering diode and/or the low-side steering diode where the punch-through SCR structure realizes low capacitance at the protected node. Furthermore, in some embodiments, the breakdown voltage of the TVS device can be tailored by connecting two or more forward biased diodes in series. The low capacitance TVS device can be configured for unidirectional or bidirectional applications. More specifically, in some embodiments, the TVS device realizes low capacitance at the protected nodes by fully or almost completely depleting the P-N junction connected to the protected node in the operating voltage range of the protected node. In this manner, the TVS device does not present undesirable parasitic capacitance to data pins being protected, especially when the data pins are used in high speed applications.

In the present description, a transient voltage suppressor (TVS) protection device refers to a protection device to protect a protected node from over-voltage transient conditions, such as voltage surges or voltage spikes. The TVS protection device ("TVS device") operates by shunting the excess current from the protected node when a surge voltage exceeding the breakdown voltage of the TVS device is applied to the protected node. A TVS device can be either a unidirectional device or a bidirectional device. A unidirectional TVS has an asymmetrical current-voltage characteristic and is typically used for protecting circuit nodes whose signals are unidirectional—that is, the signals are always above or below a certain reference voltage, such as ground. For example, a unidirectional TVS may be used to protect a circuit node whose normal signal is a positive voltage from 0V to 5V.

On the other hand, a bidirectional TVS has a symmetrical current-voltage characteristics and is typically used for protecting circuit nodes whose signals are bidirectional or can have voltage levels both above and below the reference voltage, such as ground. For example, a bidirectional TVS may be used to protect a circuit node whose normal signal varies symmetrically above and below ground, such as from −12V to 12V. In this case, the bidirectional TVS protects the circuit node from a surge voltage that goes below −12 V or above 12V.

In operation, the TVS device is in a blocking mode and is non-conductive except for possible leakage current when the voltage at the protected node is below the breakdown voltage of the TVS device, sometimes referred to as a reverse standoff voltage. That is, when the voltage at the protected node is within the normal voltage range for the protected node, the TVS device is non-conductive and is in blocking mode. However, during the blocking mode, the TVS device presents a capacitance to the protected node. When the protected node is associated with a high speed data pin, the capacitance of the TVS device in the blocking mode or non-conductive mode should be low so as not to impede the high speed operation of the data pin.

In some embodiments, the TVS device of the present invention realizes a low capacitance value of less than 0.2 pf in the blocking mode. Furthermore, the TVS device of the present invention can realize low breakdown voltage of 1 volt or less. The low capacitance and low breakdown voltage TVS device of the present invention can be advantageously applied to protect high-speed data pins or input-output (I/O) terminals in high speed electronic applications, such as data pins in USB3.1 data bus, HDMI-2.0 data bus, or V by One cables. As an example, the data signal may have a voltage amplitude of 0.4V.

The TVS device of the present invention realizes many advantages over conventional TVS devices. First, the TVS device of the present invention is constructed to ensure that the current path of the surge current flows in the lateral direction only through the semiconductor device structure of the TVS device. The lateral current flow improves the clamping voltage of the TVS device by reducing the resistance in the current path. Second, the breakdown voltage of the TVS device can be tailored to a desired value by stacking two or more forward bias diodes in series.

FIG. 1 is a circuit diagram of a bidirectional TVS protection device in embodiments of the present invention. Referring to FIG. 1, a TVS protection device 10 ("TVS device 10") includes two sets of steering diodes coupled to provide surge protection for two input-output (I/O) terminals I/O1 and I/O2. Each set of steering diodes include a high-side steering diode and a low-side steering diode. More specifically, a high-side steering diode DH1 and a low-side steering diode DL1 are coupled to the I/O terminal I/O1 as the protected node. Meanwhile, a high-side steering diode DH2 and a low-side steering diode DL2 are coupled to the I/O terminal I/O2 as the protected node. The I/O terminal I/O1 is connected to the anode of the high-side steering diode DH1 and to the cathode of the low-side steering diode DL1. Similarly, the I/O terminal I/O2 is connected to the anode of the high-side steering diode DH2 and to the cathode of the low-side steering diode DL2. The cathode terminal of the high-side steering diode DH1 is connected to a node N1 which is also the anode of the low-side steering diode DL2. The cathode terminal of the high-side steering diode DH2 is connected to a node N2 which is also the anode of the low-side steering diode DL1.

In embodiments of the present invention, the low-side steering diodes of the TVS device 10 are each implemented using a punch-through silicon controlled rectifier structure (referred herein as "PT-SCR"). In the present description, a SCR is a current-controlling device including four layers or regions of alternating P-type and N-type semiconductor materials, forming NPNP or PNPN structures. The anode of an SCR is the outermost p-type layer of the NPNP or PNPN structure, and the cathode is the outermost n-type layer of the NPNP or PNPN structure, while the gate of the SCR is connected to the p-type layer nearest to the cathode. An SCR can be symbolized as a PN junction diode with a gate terminal at the cathode terminal. As used herein, a punch-through silicon controlled rectifier refers to an SCR where the n-type region between two p-type regions is substantially depleted at a bias voltage of zero volt. That is, the two p-type regions separated by the n-type region are electrically shorted together at zero volt bias voltage due to the depletion of the n-type region. The PT-SCR structure ensures low capacitance at the protected node.

In operation, when a positive zap is applied to I/O terminal I/O1 with respect to I/O terminal I/O2, the current flows from terminal I/O1 through diode DH1, diode DL2 (PT-SCR) and into terminal I/O2. Similarly, when a negative zap is applied to I/O terminal I/O1 with respect to I/O terminal I/O2, which is equivalent to a positive zap on terminal I/O2 with respect to terminal I/O1, the current flows from terminal I/O2 through diode DH2, diode DL1 (PT-SCR) and into terminal I/O1.

In other words, a positive zap voltage applied to either of the I/O terminals will forward bias the high-side steering diode (DH1 or DH2) of the I/O terminal being zapped and when the zap voltage reaches or exceeds the breakdown voltage (BV) of the punch-through SCR structure of the low-side steering diode (DL2 or DL1), the zap current triggers the SCR and the SCR structure of the respective low-side steering diode turns on to conduct the current. The zap current exits through the other I/O terminal. A negative zap voltage applied to either of the I/O terminals will result in the same current conduction operation as if a positive zap voltage is applied to the other I/O terminal.

Figure 2:
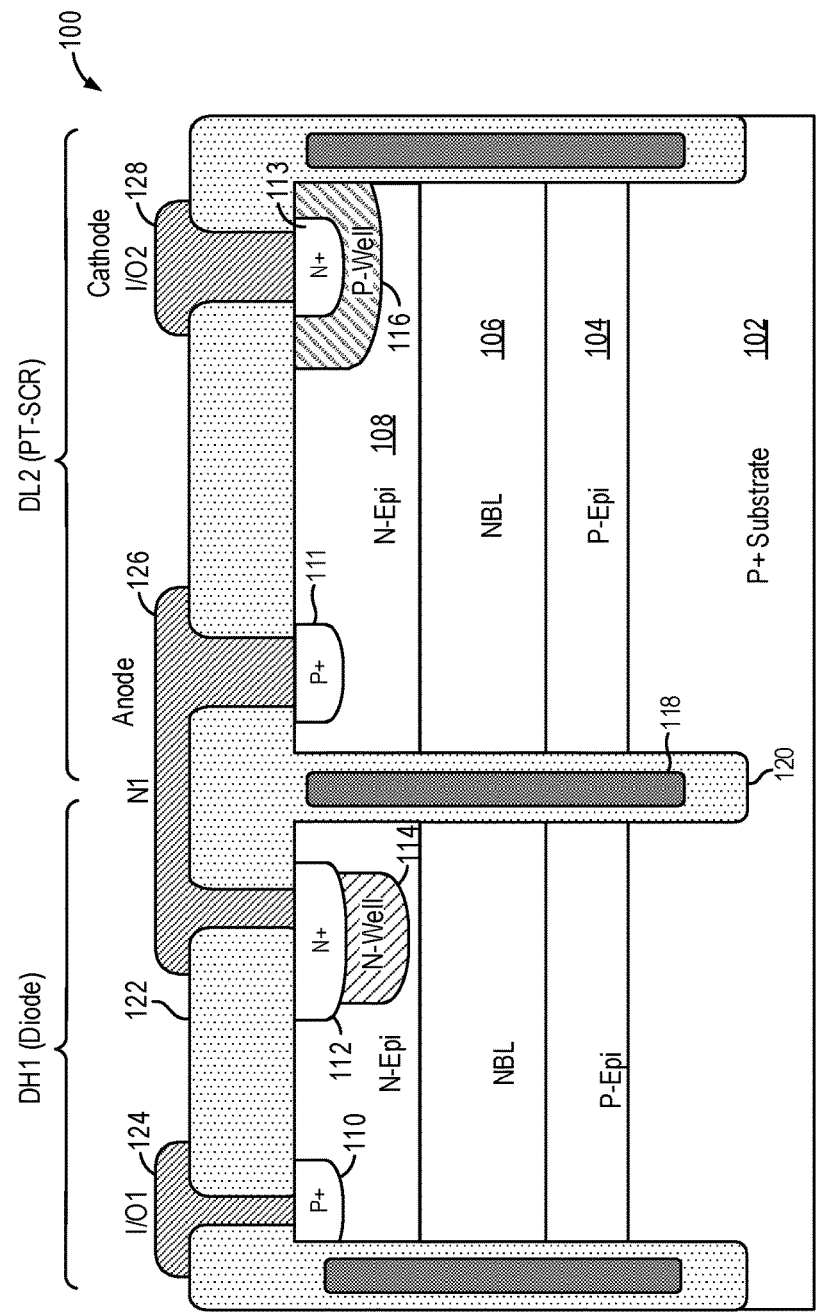
FIG. 2 is a cross-sectional view of a TVS protection device in embodiments of the present invention.

FIG. 2 is a cross-sectional view of a TVS protection device in embodiments of the present invention. In particular, the TVS protection device of FIG. 2 illustrates the construction of the TVS device 10 of FIG. 1 in some embodiments. The cross-sectional view of FIG. 2 illustrates circuit elements of the TVS device 10 including the high-side steering diode DH1 and the low-side steering diode DL2. It is understood that FIG. 2 illustrates only part of the TVS protection device and that the TVS protection device includes other elements not shown in the cross-sectional view of FIG. 2.

Referring to FIG. 2, the TVS protection device 100 ("TVS device 100") is fabricated on a P+ substrate 102. In the present embodiment, a P-type epitaxial layer 104 is formed on the P+ substrate 102. Then, an N-type buried layer (NBL) 106 are formed on the P-type epitaxial layer 104. An N-type epitaxial layer (N-Epi layer) 108 is formed on the N-type buried layer 106. The semiconductor structure for forming the TVS device is thus constructed.

In the present embodiment, trench isolation structures 120 are used to define and isolate regions of the semiconductor structure for forming the separate circuit elements. In the present embodiment, the trench isolation structures 120 are formed as oxide lined trenches filled with a polysilicon layer 118 and the trenches extend to the P+ substrate 102. In other embodiments, the trench isolation structures 120 can be formed as oxide filled trenches.

With the trench isolation structures 120 thus formed, regions in the semiconductor structure for forming the high-side steering diode and the low-side steering diode are defined. In the present embodiment, the high-side steering diode DH1 is formed as a PN junction diode with the anode formed by a heavily doped P+ region 110 and the cathode formed by a heavily doped N+ region 112, both formed in the N-type epitaxial layer 108. As thus configured, the TVS device 100 presents low capacitance to the I/O terminal I/O1 connected to the P+ region 110 because the N-type epitaxial layer 108 is lightly doped.

In the present embodiment, an N-well region 114 is formed under the N+ region 112 to form a deep junction. The deep junction formed by the N-well 114 has the effect of reducing the clamping voltage. N-well region 114 is optional and may be omitted in other embodiments of the present invention.

A metal contact 124 is made in the dielectric layer 122 to contact the P+ region 110 to form the anode terminal of the high-side steering diode DH1. Meanwhile, another metal contact 126 is made in the dielectric layer 122 to contact the N+ region 112 to form the cathode terminal of the high-side steering diode DH1. For the high-side steering diode DH1, the anode terminal 124 is connected to the I/O terminal I/O1 and the cathode terminal 126 is connected to the node N1 which is then connected to the anode of the low-side steering diode DL2 for the I/O terminal I/O2.

In embodiments of the present invention, the low-side steering diode DL2 for the I/O terminal I/O2 is formed using a punch-through silicon controlled rectifier (PT-SCR) structure. In the present embodiment, the PT-SCR structure is formed by a PNPN structure including a P+ region 111, the N-type epitaxial layer 108, the P-well 116 and an N+ region 113. The P+ region 111 and the P-Well 116 are both formed in the N-type epitaxial layer 108. The N+ region 113 is formed in the P-well 116. The P-well 116 is floating, that is, the P-well 116 is not electrically connected to or biased to any electrical potential. The metal contact 126 is made in the dielectric layer 122 to also contact the P+ region 111 to form the anode terminal of the PT-SCR of the low-side steering diode DL2. Meanwhile, a metal contact 128 is made in the dielectric layer 122 to contact the N+ region 113 to form the cathode terminal of the PT-SCR of the low-side steering diode DL2. For the low-side steering diode DL2, the anode terminal 126 is connected to the node N1 which is then connected to the cathode (N+ region 112) of the high-side steering diode DH1 for the I/O terminal I/O1 and the cathode terminal 128 is connected to the I/O terminal I/O2. By keeping the P-well 116 floating, the capacitance as seen at the I/O terminal (node 128) is reduced. In particular, the P-well 116 to N-type epitaxial layer 108 junction realizes low capacitance for the I/O terminal I/O2.

In operation, the N-Epi layer 108 is depleted from the P+ region 111 to the P-well 116 at a bias voltage of zero volt due to the high resistivity N-Epi layer 108, thereby forming the punch-through SCR structure. Thus, at 0V, the P+ region 111 is shorted to the P-well 116 and the PNP transistor of the SCR, formed by the P+ region 111, the N-Epitaxial layer 108 and the P-well 116, is punched through. In this manner, the SCR structure (P+, N-Epi, P-well, N+) is turned on all the time but the PT-SCR structure behaves like a diode while providing low capacitance at the I/O terminal I/O2. That is, while the low-side steering diode DL2 is implemented using a SCR structure, the SCR behaves as a diode in operation.

In some embodiments, the TVS device 100 further reduces the capacitance at the I/O terminal by using a thick inter-layer dielectric layer 122 or using a double metal layer structure.

Figure 3:
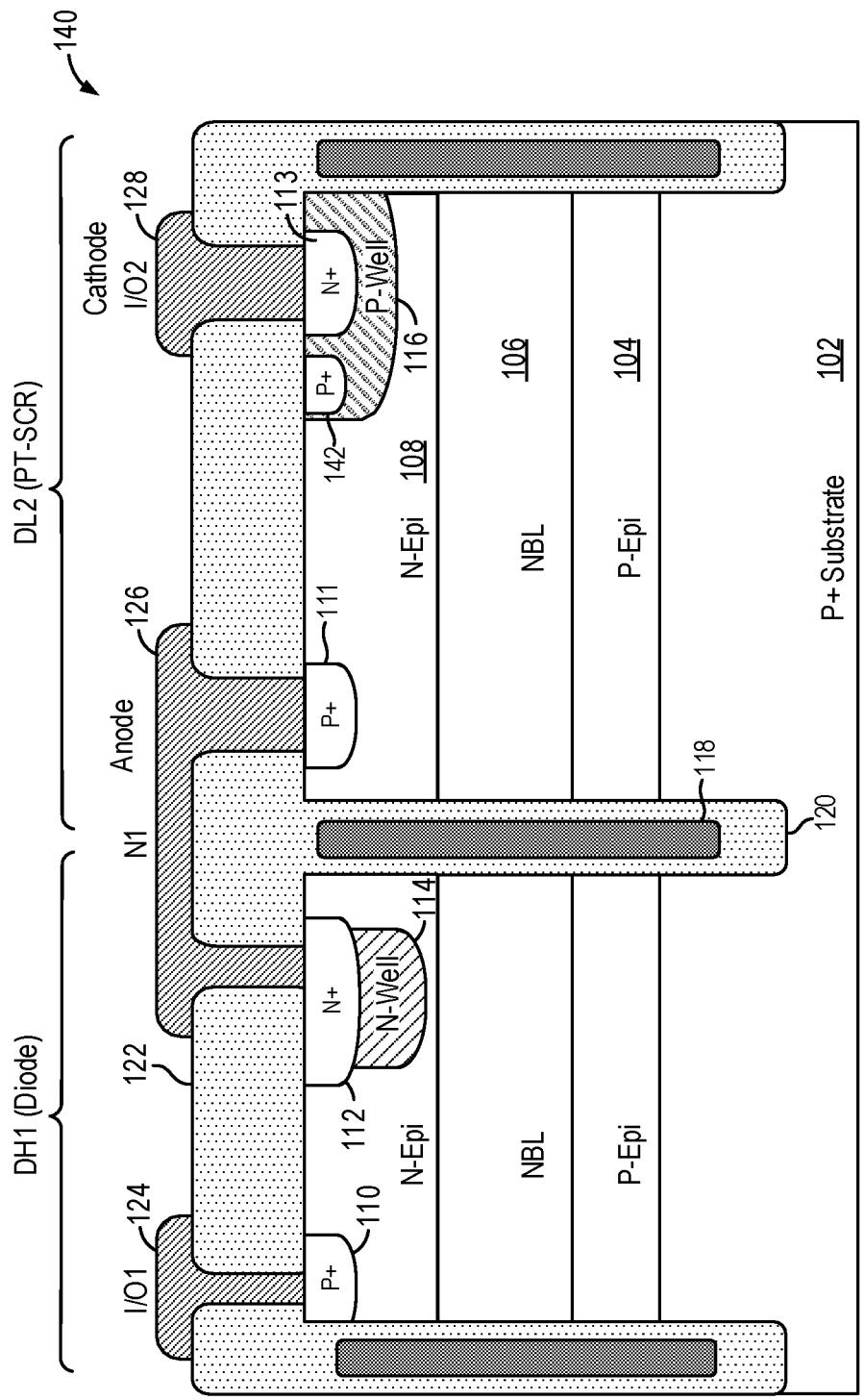
FIG. 3 is a cross-sectional view of a TVS protection device in alternate embodiments of the present invention.

FIG. 3 is a cross-sectional view of a TVS protection device in alternate embodiments of the present invention. Referring to FIG. 3, the TVS protection device 140 ("TVS device 140") is constructed in the same manner as the TVS device 100 of FIG. 2 except for the additional P+ region 142 formed in the P-well. More specifically, the punch-through SCR structure of the low-side steering diode DL2 includes the P+ region 142 formed in the P-well 116. The P+ region 142 is spaced apart from the N+ region 113. The P+ region 142 is also floating, that is the P+ region is not electrically connected to or biased to any electrical potential. With the P+ region 142 and the P-well 116 both left floating, the P-well 116 will still breakdown in a high voltage zap event. However, the N+ region 113 and the P+ region 142 will conduct in the reverse bias direction and will breakdown in the reverse bias direction.

In embodiments of the present invention, the TVS protection devices of FIGS. 2 and 3 are constructed to present a low capacitance at the protected node (the I/O terminal), such as less than 0.2 pF, and to have a low breakdown voltage, such as less than 1V. In other embodiments, the doping level of the N-type epitaxial layer of the TVS protection device can be adjusted to adjust the breakdown voltage. In some applications, a higher breakdown voltage may be desired, such as to reduce the leakage current. In some embodiments, the doping level of the N-type epitaxial layer 108 can be decreased so as to increase the breakdown voltage of the PT-SCR structure. In some examples, a TVS device with a 5V breakdown voltage can be realized.

FIGS. 2 and 3 illustrate part of the TVS protection device including the high-side steering diode of a first I/O terminal and the low-side steering diode of a second I/O terminal. It is understood that the TVS protection device includes a low-side steering diode, formed using the same PT-SCR structure, for the first I/O terminal and a high-side steering diode for the second I/O terminal.

In the embodiments shown in FIGS. 2 and 3, the low-side steering diodes of the TVS device are formed using the PT-SCR structure. In other embodiments, the high-side steering diodes of the TVS protection device are formed using the PT-SCR structure while the low-side steering diodes are formed as conventional PN junction diodes. In yet other embodiments, both the high-side steering diodes and the low-side steering diodes of the TVS device are formed using the PT-SCR structure.

Figure 13:
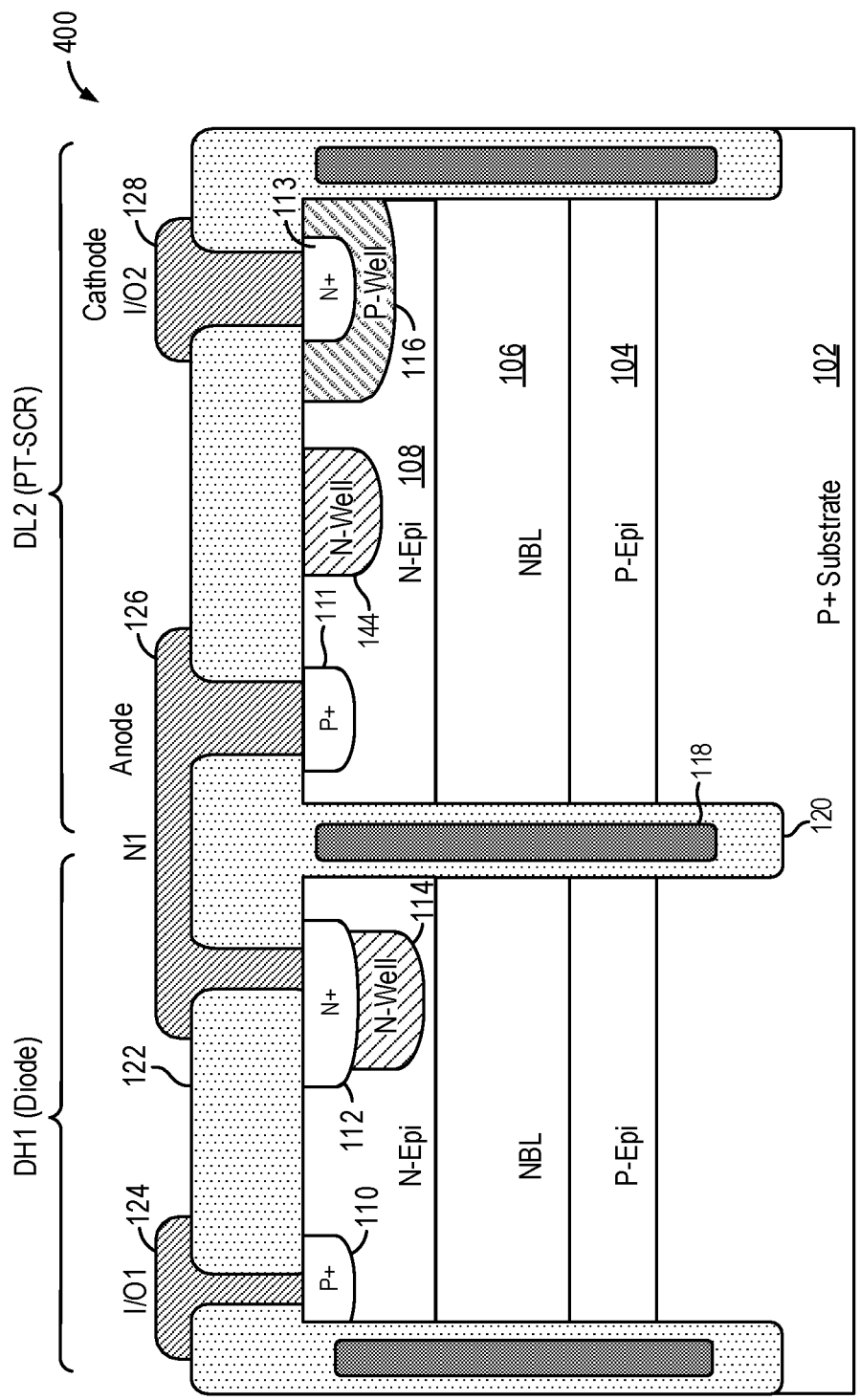
FIG. 13 is a cross-sectional view of a TVS protection device in alternate embodiments of the present invention.

FIG. 13 is a cross-sectional view of a TVS protection device in alternate embodiments of the present invention. Referring to FIG. 13, the TVS protection device 400 ("TVS device 400") is constructed in the same manner as the TVS device 100 of FIG. 2 except for the additional N-well 144 formed in the N-Epitaxial layer. More specifically, the punch-through SCR structure of the low-side steering diode DL2 includes the N-well 144 formed in the N-Epitaxial layer 108. The N-well 144 is formed between the P+ region 111 and the P-well 116. The N-well 144 is floating, that is the N-well 144 is not electrically connected to or biased to any electrical potential. N-well 144 can be included in the TVS device 400 to increase the doping level of the n-type region of the PT-SCR structure and thereby increasing the breakdown voltage of the TVS device.

Figure 14:
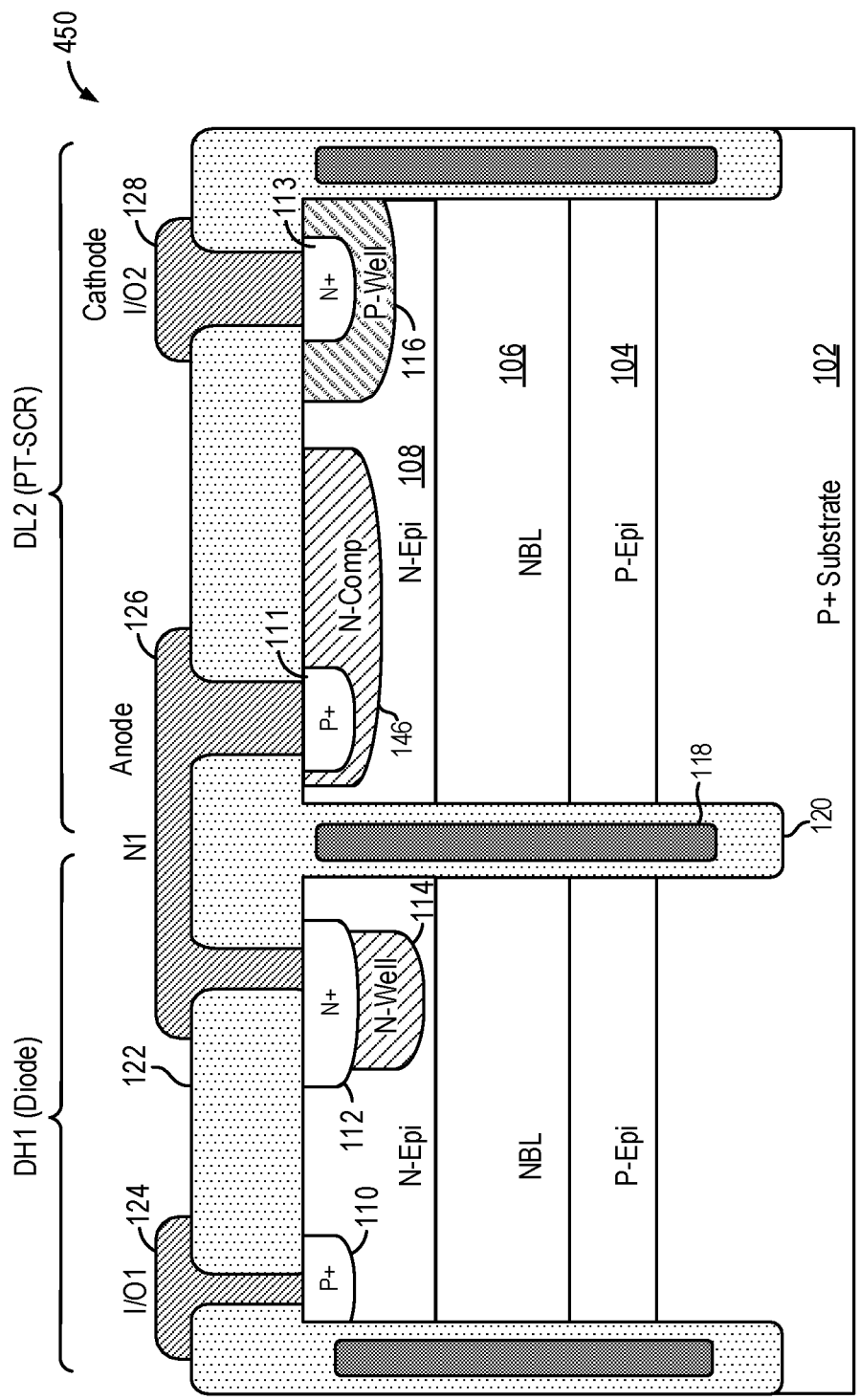
FIG. 14 is a cross-sectional view of a TVS protection device in alternate embodiments of the present invention.

FIG. 14 is a cross-sectional view of a TVS protection device in alternate embodiments of the present invention. Referring to FIG. 14, the TVS protection device 450 ("TVS device 450") is constructed in the same manner as the TVS device 100 of FIG. 2 except for the additional N-type compensation region 146 formed in the N-Epitaxial layer. More specifically, the punch-through SCR structure of the low-side steering diode DL2 includes the N-type compensation region 146 formed in the N-Epitaxial layer 108 and housing the P+ region 111. That is, the P+ region 111 is formed inside the N-type compensation region 146. The N-type compensation region 146 has the effect of increasing the doping level of the N-Epitaxial layer 108 and therefore increasing the breakdown voltage. The N-type compensation region 146 may have a doping level similar to the N-well doping level. Alternately, the N-type compensation region 146 may have a doping level different from the N-well doping level. The doping level for the N-type compensation region 146 may be selected to realize the desired breakdown voltage for the PT-SCR device.

FIG. 4, which includes FIG. 4*a*, is a top view of a TVS protection device in embodiments of the present invention. The circuit diagram of the TVS device 10 of FIG. 1 is reproduced as FIG. 4*a* in FIG. 4. FIG. 4 is provided to illustrate the overall physical layout of the TVS protection device but is not intended to be limiting. One of ordinary skill in the art would appreciate that the actual physical layout of the TVS protection device may be different and may include other elements not shown in FIG. 4.

Referring to FIG. 4, a TVS protection device 150 of the present invention is formed in a semiconductor layer. In the present embodiment, the semiconductor layer 152 includes a P+ semiconductor substrate with a P-type epitaxial layer formed thereon, an N-buried layer form on the P-type epitaxial layer and an N-type epitaxial layer formed on the N-buried layer. The TVS protection device ("TVS device") 150 includes multiple fingers of semiconductor regions arranged laterally along a first direction on a major surface of the semiconductor layer 152. Each finger is formed by a first doped region and a second doped region of opposite conductivity types arranged lengthwise in a second direction along an axis orthogonal to the first direction on the major surface of the semiconductor layer. The multiple fingers are arranged so that adjacent fingers are formed by doped regions of opposite conductivity types. That is, a first finger may be formed with a first doped region of the first conductivity type and a second doped region of the second conductivity type. Then, a second finger, adjacent to the first finger, will be formed with a first doped region of the second conductivity type and a second doped region of the first conductivity type.

As thus configured, the TVS device 150 includes a region 154 in which the diode structure for the high-side steering diode is formed and a region 156 in which the PT-SCR structure for the low-side steering diode is formed. Element 170 denotes the trench isolation structure. Conductive lines connect the diodes and the PT-SCR structures to form the TVS device of FIG. 4*a*. For example, conductive lines are used to connect the anode of the high-side steering diode to the I/O terminal I/O1 and to connect the cathode of the high-side steering diode to the PT-SCR structure of the low-side steering diode of I/O terminal I/O2.

In embodiments of the present invention, the I/O terminal is formed by a metal pad 158. In some embodiments, the metal pad 158 is a metal2 layer. An opening 160 in the passivation layer is formed to expose a portion of the metal pad 158. Then a polyimide layer is formed and an opening 162 in the polyimide layer is formed again to expose the portion of the metal pad 158. In some embodiments, the TVS device 150 is packaged using a chip-scale semiconductor package and the metal pad 158 is used as a pad for forming one or more copper pillar bumps thereon to form the contacts of the I/O terminals. With using copper pillar bumps, the area of the metal pad for the I/O terminal can be made smaller and the capacitance at the I/O terminal can be significantly reduced.

In FIG. 4, the openings 160 and 162 to expose the metal pad 158 is formed as a single large rectangular opening. In other embodiments, multiple small openings can be used instead of a single large opening. A series of openings can be used with one or more copper pillar bumps formed in each opening. In the case of chip-scale packing, an array of copper pillar bumps can be formed in the series of openings to provide the electrical connection to the metal pad.

Figure 5:
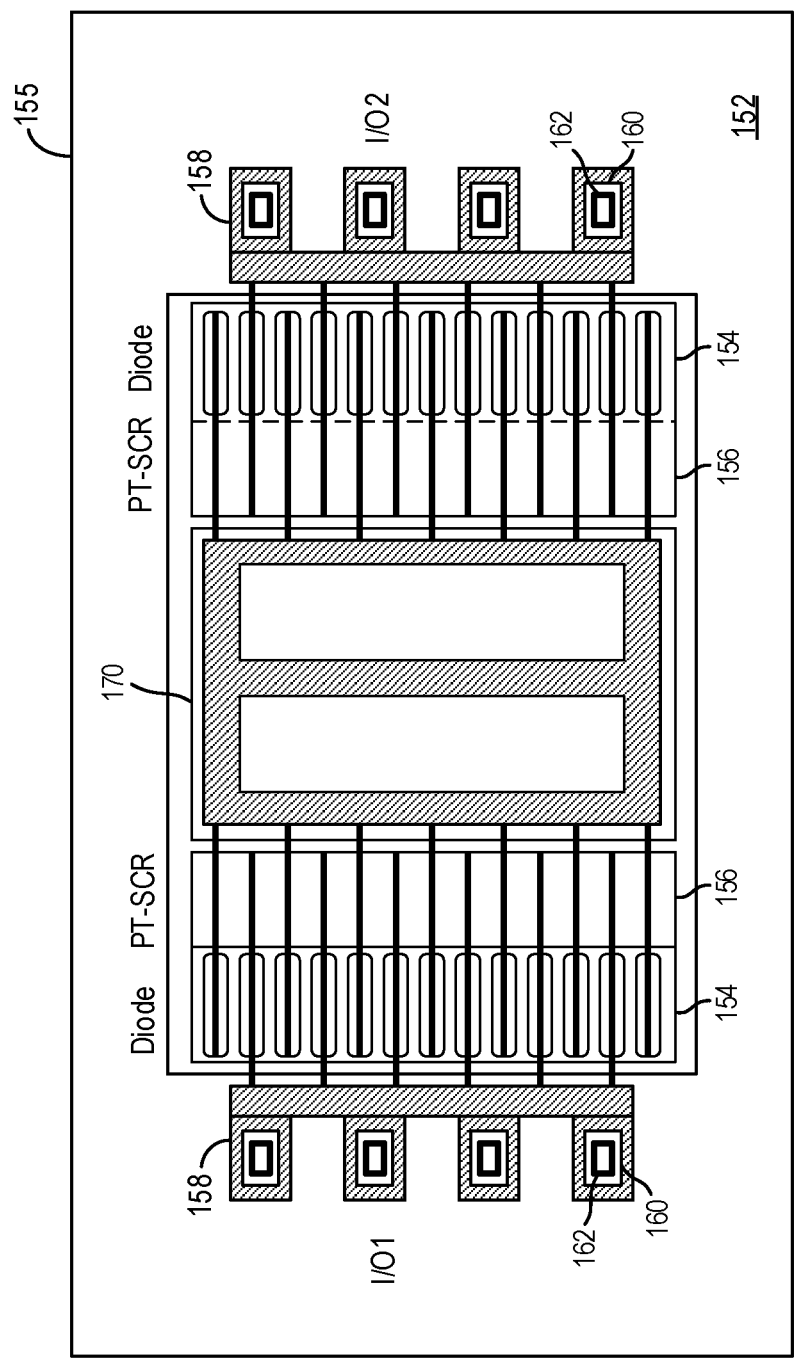
FIG. 5 is a top view of a TVS protection device in embodiments of the present invention.

FIG. 5 is a top view of a TVS protection device in alternate embodiments of the present invention. Referring to FIG. 5, a TVS device 155 includes I/O terminals that are formed using separate metal pad portions 158, where each metal pad portion can be configured to receive one or more copper pillar bump. In each metal pad portion, an opening 160 in the passivation layer is formed to expose a portion of the metal pad 158. Then a polyimide layer is formed and an opening 162 in the polyimide layer is formed again to expose the portion of the metal pad 158. Copper pillar bumps can then be formed in the openings 162 to form the electrical connection to the metal pad portions 158. In this manner, electrical connection to the metal pad 158 can be accomplished while reducing the capacitance at the I/O terminals.

In the conventional TVS device, a bond pad sufficiently large to accommodate a bond wire is used to form the I/O terminal. The bond pad introduces a large amount of capacitance to the I/O terminal. In the embodiments described with reference to FIGS. 4 and 5, the traditional bond pad structure is eliminated. Instead, the metal pad 158 having a smaller dimension than a bond pad is used. In some cases, the TVS device is packaged using chip-scale packaging and copper pillar bumps may be used to connect to the metal pad. In this manner, the parasitic capacitance introduced by using a large bond pad for accommodating a bond wire is eliminated and the TVS device can realize even lower capacitance at the I/O terminal.

In alternate embodiments of the present invention, instead of forming the metal pad 158 to the sides of the diode/PT-SCR structures in an inactive area, the metal pad 158 can be positioned directly on the diodes/PT-SCR structures, that is in the active area of the device defined by regions 154 and 156. Vias can be used to connect the conductive lines contacting the doped regions to the overlying metal pad.

In some applications, a TVS protection device having increased breakdown voltage is desired. Increasing the breakdown voltage of the TVS protection device has the effect of reducing the leakage current through the TVS protection device. In some embodiments, the TVS protection device is constructed using a stacked diode structure to increase the breakdown voltage and decrease the leakage current. FIG. 6, which includes FIG. 6*a*, is a top view of a TVS protection device in alternate embodiments of the present invention. FIG. 6*a* illustrates the circuit diagram of the TVS protection device in some embodiments. FIG. 6 is provided to illustrate the overall physical layout of the TVS protection device but is not intended to be limiting. One of ordinary skill in the art would appreciate that the actual physical layout of the TVS protection device may be different and may include other elements not shown in FIG. 6.

Referring to FIG. 6*a*, a TVS device 20 is constructed in a similar manner as TVS device 10 of FIG. 1 except that the high-side steering diode is formed using a stacked diode structure. In particular, TVS device 20 includes a pair of serially connected diodes DH1a and DH1b as the high-side steering diode for the I/O terminal I/O1. TVS device 20 further includes a pair of serially connected diodes DH2a and DH2b as the high-side steering diode for the I/O terminal I/O2. In the present description, a stacked diode structure refers to two or more diodes that are connected in series where cathode of one diode is connected to the anode of the other diode. The anode of the first diode in the series is coupled to the I/O terminal and the cathode of the last diode in the series is coupled to the floating node (N1 or N2).

The stacked diode structure is effective in increasing the breakdown voltage of the TVS device without increasing the capacitance at the I/O terminals. In particular, each I/O terminal is connected to the punch-through SCR structure as the low-side steering diode which ensures low capacitance. Meanwhile, the high-side steering diode is implemented using the stacked diode structure where the one or more additional diodes in series add additional diode voltage drop to the breakdown voltage. For example, diode DH1b adds an additional 0.7 volt voltage drop to the breakdown voltage. However, adding diode DH1b does not add additional capacitance to the I/O terminal as the stacked diode (DH1b, DH2b) is not connected to the I/O terminal. Accordingly, in some embodiments, the stacked diode (DH1b, DH2b) can be constructed with a large device size so as to achieve low resistance and improve the clamping voltage.

FIG. 6 illustrates the layout of a TVS protection device implementing the TVS device 20 of FIG. 6a. Referring to FIG. 6, the TVS protection device 180 ("TVS device 180") is constructed in a similar manner as the TVS protection device 150 of FIG. 4 except for the stacked diode and the I/O terminal structure. As shown in FIG. 6, the TVS device 180 includes a region 184 in which the first diode (DH1a, DH2a) for the high-side steering diode is formed and a region 186 in which the PT-SCR structure for the low-side steering diode is formed. The TVS device 180 further includes a region 188 in which the stacked diodes (DH1b, DH2b) are formed. As illustrated in FIG. 6, each stacked diode (DH1b, DH2b) is formed using a device area much larger than the device area for the first diode (DH1a, DH2a). In this manner, the TVS protection device 180 realizes increased breakdown voltage with reduced resistance and lowered leakage while maintaining the same low capacitance at the I/O terminals.

In the embodiment shown in FIG. 6, each of the I/O terminals is formed using a metal pad structure 190 to form a bond pad 195 for receiving a bond wire. FIG. 6 illustrates an example of the traditional bond pad connection. As explained above the bond pad 195 may introduce additional capacitance to the I/O terminal due to its size and the capacitance to the silicon substrate below. When further reduction in capacitance is desired, the metal pad structure described with reference to FIGS. 4 and 5 can be used to form the connection to the I/O terminals. The metal pad structure 190 and bond pad 195 in FIG. 6 are illustrative only and not intended to be limiting.

In the embodiment described in FIG. 6, the stacked diode structure includes a pair of serially connected diodes. FIG. 6 is illustrative only and not intended to be limiting. In other embodiments, the TVS device can be constructed using a stacked diode structure for the high-side steering diode (the forward bias diode) where the stacked diode structure includes two or more serially connected diodes. The number of diodes used is selected to realize the desired breakdown voltage for the TVS device.

Figure 7:
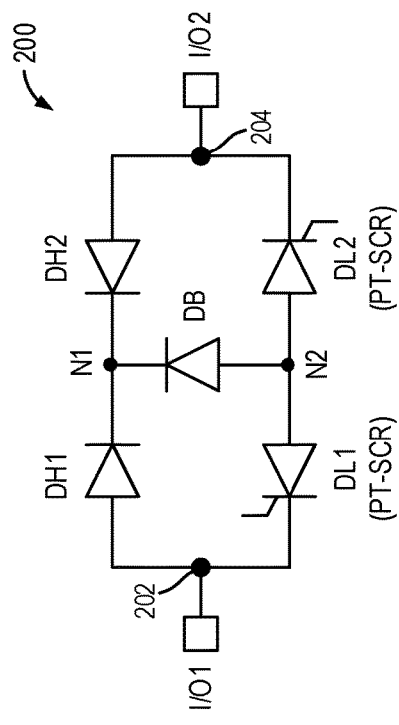
FIG. 7 is a circuit diagram of a bidirectional TVS protection device in embodiments of the present invention.

FIG. 7 is a circuit diagram of a bidirectional TVS protection device in embodiments of the present invention. Referring to FIG. 7, a TVS device 200 includes two sets of steering diodes coupled to provide surge protection for two input-output (I/O) terminals I/O1 and I/O2. Each set of steering diodes include a high-side steering diode and a low-side steering diode. More specifically, a high-side steering diode DH1 and a low-side steering diode DL1 are coupled to the I/O terminal I/O1 as the protected node. Meanwhile, a high-side steering diode DH2 and a low-side steering diode DL2 are coupled to the I/O terminal I/O2 as the protected node. The I/O terminal I/O1 is connected to the anode of the high-side steering diode DH1 and to the cathode of the low-side steering diode DL1. Similarly, the I/O terminal I/O2 is connected to the anode of the high-side steering diode DH2 and to the cathode of the low-side steering diode DL2. The cathode terminals of diodes DH1 and DH2 are connected to a node N1. The anode terminals of diodes DL1 and DL2 are connected to a node N2.

The TVS device 200 also includes a blocking diode DB as a clamp device. In the example shown in FIG. 7, the blocking diode DB has a cathode connected to node N1 and an anode connected to node N2. In the bidirectional TVS device 200, the nodes N1 and N2 are floating, that is, nodes N1 and N2 are not electrically connected to or biased to any electrical potential.

In TVS device 200, the low-side steering diodes DL1 and DL2 are implemented using the punch-through SCR structure described above with reference to FIGS. 2 and 3. In this manner, the TVS device 200 can realize low capacitance at the I/O terminals.

Figure 8:
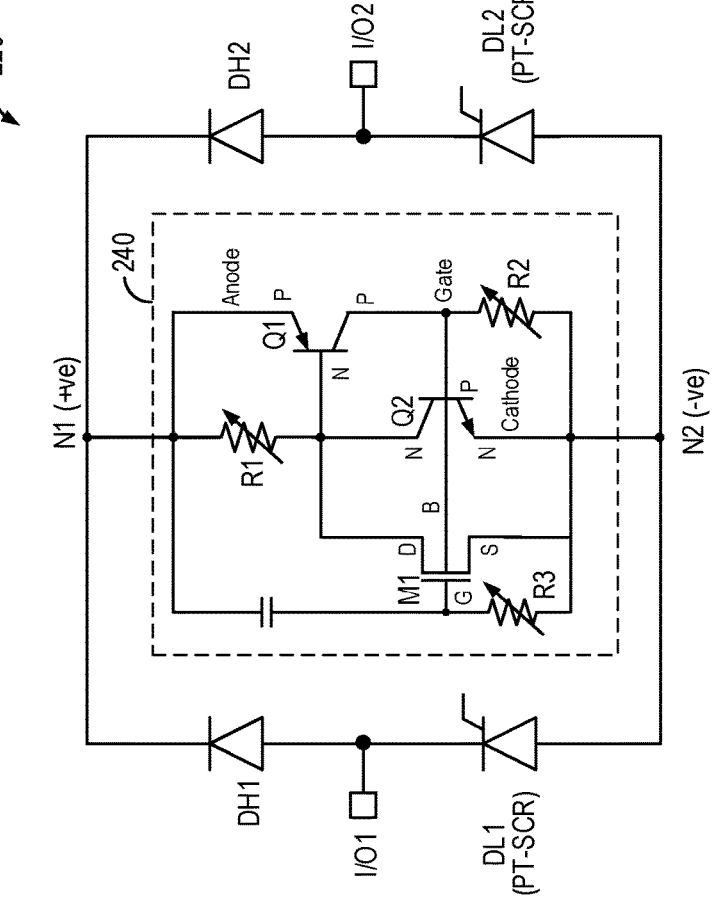
FIG. 8 is a circuit diagram of a bidirectional TVS protection device in embodiments of the present invention.

In some embodiments, the clamp device is implemented using a diode and a SCR. In some embodiments, the clamp device can be constructed as described in commonly assigned U.S. patent application Ser. No. 15/605,662, entitled LOW CAPACITANCE BIDIRECTIONAL TRANSIENT VOLTAGE SUPPRESSOR, now U.S. Pat. No. 10,062,682, which is incorporated herein by reference in its entirety. FIG. 8 is a circuit diagram of a bidirectional TVS protection device in embodiments of the present invention. In particular, FIG. 8 illustrates a TVS protection device 220 including a clamp device 240 formed by a diode-connected NMOS transistor M1 integrated with a diode triggered silicon controlled rectifier (SCR) having an anode, a cathode, and a gate. IN particular, the SCR is formed by a PNP bipolar transistor Q1 and an NPN bipolar transistor Q2. The TVS protection device 220 is based on the TVS device 20 in FIG. 6 of the aforementioned '682 patent. The construction and operation of the clamp device 240 is described in the '682 patent and the description will not be repeated here. In brief, in response to a voltage applied to one of the protected nodes exceeding a given voltage level, the diode-connected NMOS transistor triggers a current flow at the SCR and the SCR clamps the voltage at the respective protected node at a clamping voltage. In the TVS protection device 220, the low-side steering diodes DL1 and DL2 are implemented using the punch-through SCR structure described above with reference to FIGS. 2 and 3. In this manner, the TVS device 220 can realize low capacitance at the I/O terminals.

Figure 9:
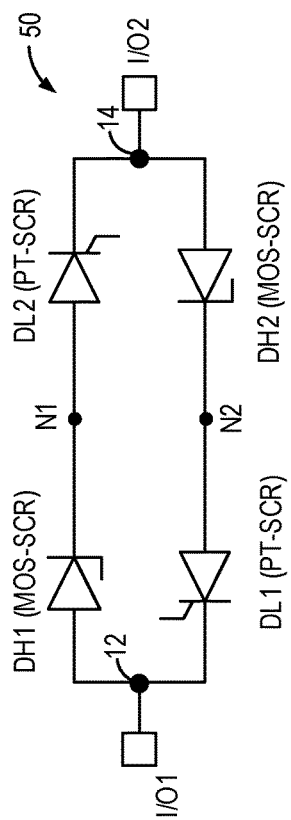
FIG. 9 is a circuit diagram of a bidirectional TVS protection device in alternate embodiments of the present invention.

FIG. 9 is a circuit diagram of a bidirectional TVS protection device in alternate embodiments of the present invention. Referring to FIG. 9, a TVS device 50 includes two sets of steering diodes coupled to provide surge protection for two input-output (I/O) terminals I/O1 and I/O2. Each set of steering diodes include a high-side steering diode and a low-side steering diode. More specifically, a high-side steering diode DH1 and a low-side steering diode DL1 are coupled to the I/O terminal I/O1 as the protected node. Meanwhile, a high-side steering diode DH2 and a low-side steering diode DL2 are coupled to the I/O terminal I/O2 as the protected node. The I/O terminal I/O1 is connected to the anode of the high-side steering diode DH1 and to the cathode of the low-side steering diode DL1. Similarly, the I/O terminal I/O2 is connected to the anode of the high-side steering diode DH2 and to the cathode of the low-side steering diode DL2. The cathode terminal of the high-side steering diode DH1 is connected to a node N1 which is also the anode of the low-side steering diode DL2. The cathode terminal of the high-side steering diode DH2 is connected to a node N2 which is also the anode of the low-side steering diode DL1.

In the present embodiment, the low-side steering diodes of the TVS device 50 are each implemented using a punch-through silicon controlled rectifier structure as described above. The PT-SCR structure ensures low capacitance as seen by the I/O terminal coupled thereto. Furthermore, in the present embodiment, the high-side steering diodes of the TVS device 50 are each implemented using a MOS-triggered silicon controlled rectifier structure. The MOS-triggered SCR structure enables the TVS device to realize low breakdown voltage, such as less than 5V. In particular, the threshold voltage of the MOS transistor can be adjusted to achieve a low breakdown voltage for the TVS device.

Figure 10:
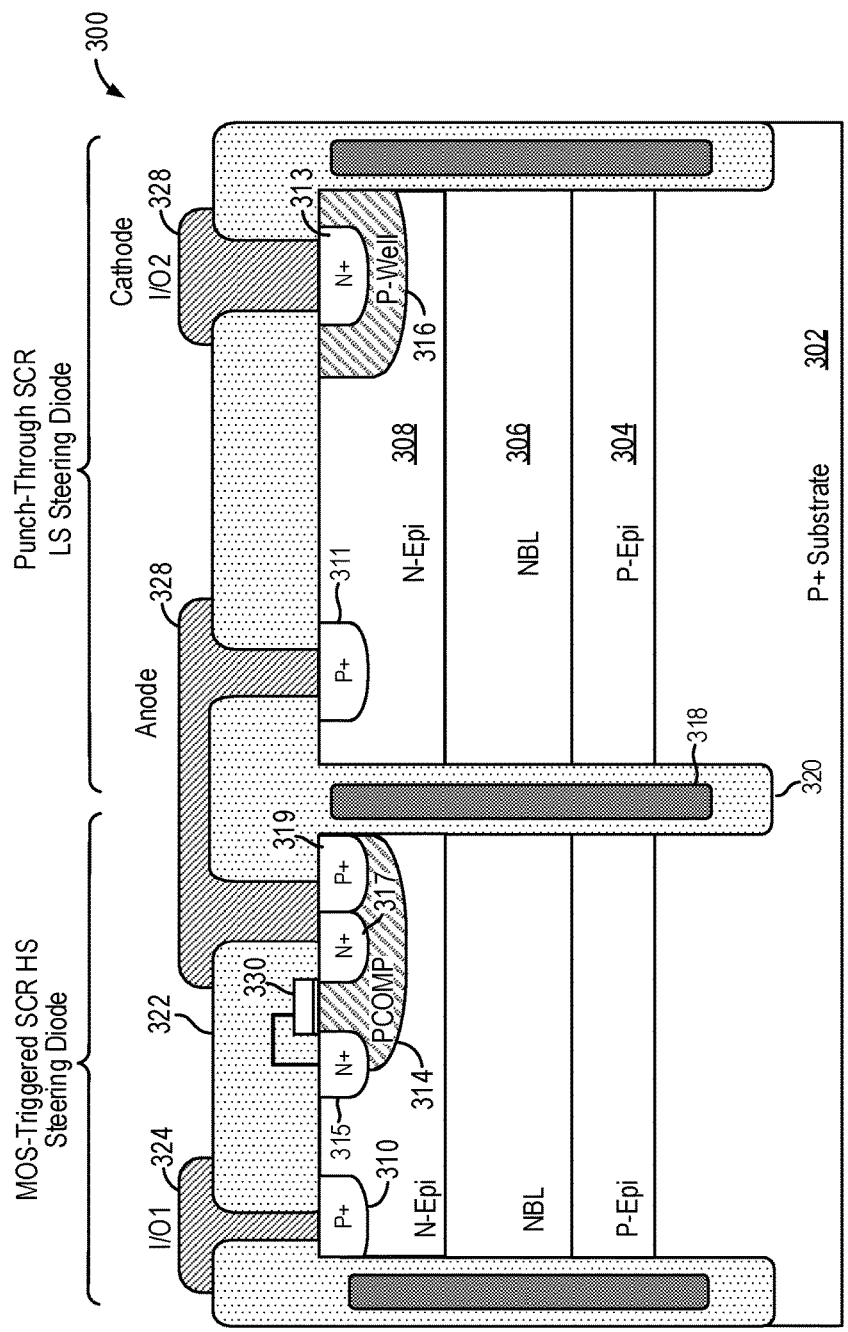
FIG. 10 is a cross-sectional view of a TVS protection device in embodiments of the present invention.

FIG. 10 is a cross-sectional view of a TVS protection device in embodiments of the present invention. In particular, the TVS protection device of FIG. 10 illustrates the construction of the TVS device 50 of FIG. 9 in some embodiments. The cross-sectional view of FIG. 10 illustrates circuit elements of the TVS device 50 including the high-side steering diode DH1 and the low-side steering diode DL2. It is understood that FIG. 10 illustrates only part of the TVS protection device and that the TVS protection device includes other elements not shown in the cross-sectional view in FIG. 10.

Referring to FIG. 10, the TVS protection device 300 ("TVS device 300") is fabricated on a P+ substrate 302. In the present embodiment, a P-type epitaxial layer 304 is formed on the P+ substrate 302. Then, an N-type buried layer (NBL) 306 are formed on the P-type epitaxial layer 304. An N-type epitaxial layer (N-Epi layer) 308 is formed on the N-type buried layer 306. The semiconductor structure for forming the TVS device is thus constructed.

In the present embodiment, trench isolation structures 320 are used to define and isolate regions of the semiconductor structure for forming the separate circuit elements. In the present embodiment, the trench isolation structures 320 are formed as oxide lined trenches filled with a polysilicon layer 318 and the trenches extend to the P+ substrate 302. In other embodiments, the trench isolation structures 320 can be formed as oxide filled trenches.

With the trench isolation structures 320 thus formed, regions in the semiconductor structure for forming the high-side steering diode and the low-side steering diode are defined. In the present embodiment, the high-side steering diode DH1 is formed as a MOS-triggered SCR structure. The SCR structure is formed by a PNPN structure including a P+ region 310, the N-type epitaxial layer 308, a P-type compensation (P-Comp) region 314 and an N+ region 317. The P-Comp region 314 is floating, that is, the P-Comp region 314 is not electrically connected to or biased to any electrical potential. An NMOS transistor is formed in the P-Comp region 314. In particular, a gate structure 330, including a gate electrode and a gate dielectric layer, is formed above the P-comp region 314 and is positioned between N+ regions 315 and 317 as the drain and source regions. The N+ region 315 forms the drain region of the MOS transistor and is electrically shorted to the gate electrode of the MOS transistor. In this manner, the MOS transistor behaves as a gated diode and current flows from the N+ drain 315 to the N+ source 317 when the MOS transistor is turned on. As thus configured, the MOS-triggered SCR provides a diode voltage drop plus the threshold voltage of the MOS transistor. The threshold voltage of the MOS transistor can be adjusted to obtain the desired breakdown voltage for the TVS device 300. In operation, once the current flowing through the MOS transistor is sufficient to turn on the SCR, the SCR conducts the current and the MOS transistor current is no longer relevant.

In the MOS-triggered SCR structure, a P+ region 319 is provided in the P-Comp region 314 to as the body contact region. The P+ region 319 is electrically shorted to the N+ source region 317. Metal contact 324 is made in the dielectric layer 322 to contact the P+ region 310 to form the anode terminal of the MOS-triggered SCR. Meanwhile, a metal contact 328 is made in the dielectric layer 322 to contact the N+ region 317 and P+ body contact region 319 to form the cathode terminal of the MOS-triggered SCR.

In embodiments of the present invention, the low-side steering diode DL2 for the I/O terminal I/O2 is formed using a punch-through silicon controlled rectifier (PT-SCR) structure, as described above. More specifically, the PT-SCR structure is formed by a PNPN structure including a P+ region 311, the N-type epitaxial layer 308, the P-well 316 and an N+ region 313. The N+ region 313 is formed inside the P-well 316. The P-well 316 is floating, that is, the P-well 316 is not electrically connected to or biased to any electrical potential. The metal contact 328 is made in the dielectric layer 322 to contact the P+ region 311 to form the anode terminal of the PT-SCR of the low-side steering diode DL2. Meanwhile, a metal contact 328 is made in the dielectric layer 322 to contact the N+ region 313 to form the cathode terminal of the PT-SCR of the low-side steering diode DL2. By keeping the P-well 316 floating, the capacitance as seen at the I/O terminal (node 328) is reduced. In particular, the P-well 316 to N-type epitaxial layer 308 junction realizes low capacitance for the I/O terminal I/O2.

In some embodiments, the P-type compensation region 314 has a doping level that is higher than the doping level of the N-type epitaxial layer 308 but is lower than the heavily doped P+ region 319 used to make ohmic contact to the P-Comp region 314. In some embodiments, the P-type compensation region 314 has a doping level similar to the P-well 316 but the P-type compensation region 314 may have a surface doping level that is lower than the P-well 316 in order to tailor the threshold voltage of the MOS transistor. In alternate embodiments of the present invention, the P-type compensation region 314 can be formed as a P-well region, that is, having the same doping level as the P-well region 316. When a P-well region is used in placed of the P-type compensation region, surface doping may be used to adjust the doping concentration at the channel region of the MOS transistor.

In alternate embodiments of the present invention, an N-well can be added to the N-Epitaxial layer 308 of the PT-SCR device, in the same manner as shown in FIG. 13 to increase the breakdown voltage of the PT-SCR device. Alternately, in other embodiments, an N-type compensation region can be added to the N-Epitaxial layer 308 of the PT-SCR device, in the same manner as shown in FIG. 14 to increase the breakdown voltage of the PT-SCR device.

Figure 15:
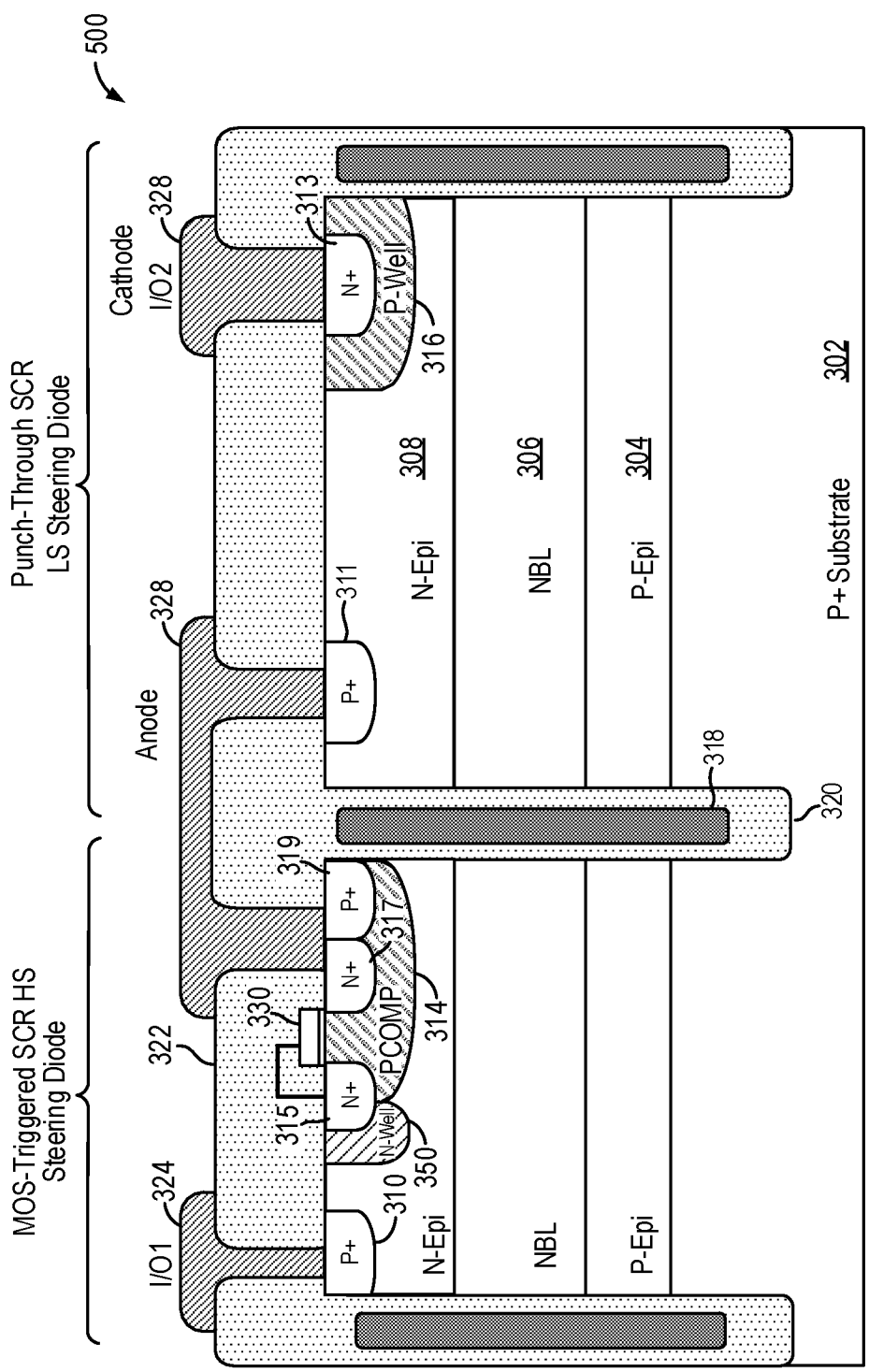
FIG. 15 is a cross-sectional view of a TVS protection device in alternate embodiments of the present invention.

Furthermore, in further alternate embodiments, an N-well can be added to the MOS-triggered SCR device, as shown in FIG. 15. FIG. 15 is a cross-sectional view of a TVS protection device in alternate embodiments of the present invention. Referring to FIG. 15, the TVS protection device 500 ("TVS device 500") is constructed in the same manner as the TVS device 300 of FIG. 10 except for the additional N-well region 350 formed in the N-Epitaxial layer 308 of the MOS-triggered SCR. More specifically, the N-well region 350 is formed adjacent to the P-type compensation region 314. The N-well region 350 can be added to increase the breakdown voltage of the MOS-triggered SCR device.

Figure 11:
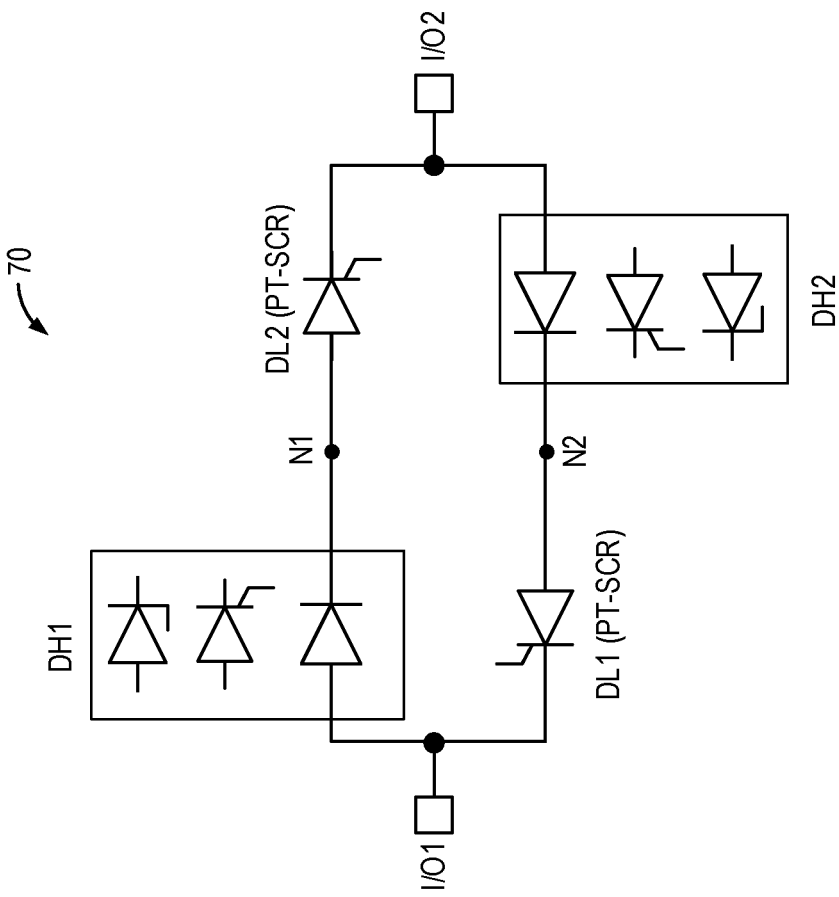
FIG. 11 is a circuit diagram of a bidirectional TVS protection device in alternate embodiments of the present invention.

FIG. 11 is a circuit diagram of a bidirectional TVS protection device in alternate embodiments of the present invention. Referring to FIG. 11, a TVS device 70 includes two sets of steering diodes coupled to provide surge protection for two input-output (I/O) terminals I/O1 and I/O2. Each set of steering diodes include a high-side steering diode and a low-side steering diode.

In embodiments of the present invention, the low-side steering diodes DL1 and DL2 are constructed using the punch-through silicon controlled rectifier (PT-SCR) structure. Meanwhile, each of the high-side steering diodes DH1 and DH2 can be constructed using a PN junction diode, a PT-SCR structure, or a MOS-triggered SCR structure. The PN junction diode and the PT-SCR structure are described above with reference to FIGS. 2 and 3. The MOS-triggered SCR structure is described above with reference to FIGS. 9 and 10. As thus configured, the TVS device 70 can realize low capacitance while optimizing the breakdown voltage of the TVS device and reducing the leakage current at the I/O terminal.

The above described embodiments illustrate various bidirectional TVS protection devices. The punch-through SCR structure and the MOS-triggered SCR structure can also be applied to unidirectional TVS protection devices in alternate embodiments of the present invention. In a unidirectional TVS protection device, the high-side steering diode and the low-side steering diode are coupled between the protected node and the ground potential.

Figure 12:
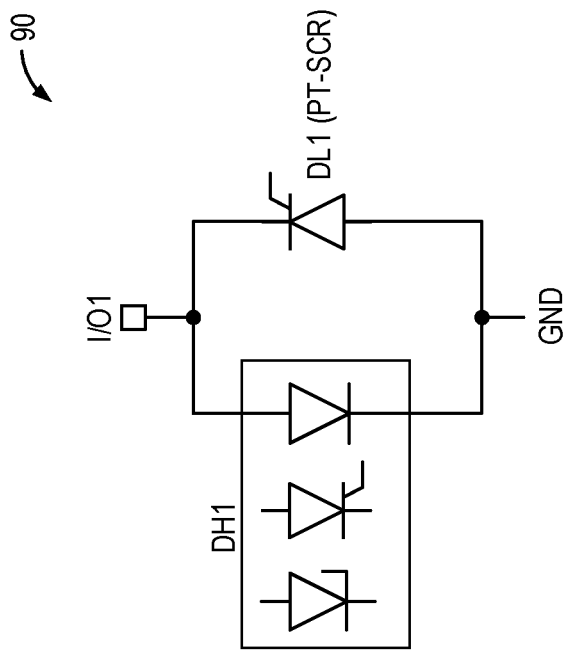
FIG. 12 is a circuit diagram of a unidirectional TVS protection device in alternate embodiments of the present invention.

FIG. 12 is a circuit diagram of a unidirectional TVS protection device in alternate embodiments of the present invention. Referring to FIG. 12, a TVS device 90 includes a high-side steering diode DH1 and a low-side steering diode DL1 connected back-to-back to the protected node (I/O terminal) and ground. In particular, the anode of the high-side steering diode and the cathode of the low-side steering diode are connected to the I/O terminal. Meanwhile, the cathode of the high-side steering diode and the anode of the low-side steering diode are connected to the ground terminal.

In embodiments of the present invention, the low-side steering diode DL1 is constructed using the punch-through silicon controlled rectifier (PT-SCR) structure. Meanwhile, the high-side steering diode DH1 can be constructed using a PN junction diode, a PT-SCR structure, or a MOS-triggered SCR structure. The PN junction diode and the PT-SCR structure is described above with reference to FIGS. 2 and 3. The MOS-triggered SCR structure is described above with reference to FIGS. 9 and 10. As thus configured, the TVS device 90 can realize low capacitance while optimizing the breakdown voltage of the TVS device and reducing the leakage current at the I/O terminal.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A transient voltage suppressing (TVS) device comprising:
   a semiconductor layer comprising a first epitaxial layer of a first conductivity type;
   a plurality of active regions formed in the semiconductor layer, the active regions being isolated from each other by isolation structures;
   a high-side steering diode formed in a first active region and having an anode terminal coupled to a first protected node and a cathode terminal;
   a low-side steering diode formed in a second active region of the plurality of active regions and having a cathode terminal coupled to a second protected node and an anode terminal;
   wherein the low-side steering diode comprises a punch-through silicon controlled rectifier, the punch-through silicon controlled rectifier comprising:
   a first doped region of a second conductivity type, opposite the first conductivity type, formed in the first epitaxial layer;
   a first well of the second conductivity type formed in the first epitaxial layer spaced apart from the first doped region, wherein the first well is not biased to any electrical potential; and
   a second doped region of the first conductivity type formed in the first well,
   wherein the first doped region, the first epitaxial layer, the first well and the second doped region form the punch-through silicon controlled rectifier, the first doped region forming the anode and the second doped region forming the cathode of the punch-through silicon controlled rectifier.

2. The TVS device of claim 1, wherein the semiconductor layer further comprises a second epitaxial layer of the second conductivity type and a first buried layer of the first conductivity type formed on the second epitaxial layer, wherein the first epitaxial layer is formed on the first buried layer.

3. The TVS device of claim 1, wherein the punch-through silicon controlled rectifier of the low-side steering diode further comprises:

a third doped region of the second conductivity type formed in the first well and adjacent the second doped region, wherein the third doped region is not biased to any electrical potential.

4. The TVS device of claim 1, wherein the punch-through silicon controlled rectifier of the low-side steering diode further comprises:
   a second well region of the first conductivity type formed in the first epitaxial layer adjacent the first well and positioned between the first doped region and the first well.

5. The TVS device of claim 4, wherein second well region is not biased to any electrical potential.

6. The TVS device of claim 1, wherein the punch-through silicon controlled rectifier of the low-side steering diode further comprises:
   a fourth doped region of the first conductivity type formed in the first epitaxial layer apart from the first well, the first doped region being formed inside the fourth doped region, the fourth doped region being more lightly doped than the first doped region and being more heavily doped than the first epitaxial layer.

7. The TVS device of claim 1, wherein the high-side steering diode comprises a MOS-triggered silicon controlled rectifier formed in the first active region, the MOS-triggered silicon controlled rectifier including alternating p-type and n-type regions and a diode-connected MOS transistor integrated therein to trigger the silicon controlled rectifier to turn on.

8. The TVS device of claim 7, wherein the MOS-triggered silicon controlled rectifier comprises:
   a fifth doped region of the second conductivity type formed in the first epitaxial layer;
   a sixth doped region of the second conductivity type formed in the first epitaxial layer and being spaced apart from the fifth doped region, the sixth doped region having a lower doping level than the doping level of the fifth doped region;
   a seventh doped region of the first conductivity type formed at least partially in the sixth doped region;
   an eighth doped region of the first conductivity type formed in the sixth doped region and spaced apart from the seventh doped region; and
   a conductive gate formed above the semiconductor layer and insulated from the semiconductor layer by a gate dielectric layer, the conductive gate being positioned between the seventh doped region and the eighth doped region,
   wherein the conductive gate, the seventh doped region and the eighth doped region form a MOS transistor with the sixth doped region being the body of the MOS transistor, the seventh doped region being electrically connected to the conductive gate to form a diode-connected MOS transistor.

9. The TVS device of claim 8, wherein the fifth doped region, the first epitaxial layer, the sixth doped region and the eighth doped region form the silicon controlled rectifier, the diode-connected MOS transistor being turned on to trigger the silicon controlled rectifier to turn on.

10. The TVS device of claim 8, wherein the sixth doped region has a doping level higher than the doping level of the first epitaxial layer and lower than the doping level of the fifth doped region.

11. The TVS device of claim 8, wherein a threshold voltage of the MOS transistor is adjusted to adjust a breakdown voltage of the TVS device.

12. The TVS device of claim 8, wherein the MOS-triggered silicon controlled rectifier further comprises:
   a third well region of the first conductivity type formed in the first epitaxial layer adjacent the sixth doped region and positioned between the fifth doped region and the sixth doped region.

13. The TVS device of claim 1, wherein the high-side steering diode comprises a PN junction diode.

14. The TVS device of claim 6, wherein the high-side steering diode comprises a PN junction diode, the PN junction diode comprising:
   a ninth doped region of the second conductivity type formed in the first active region of the first epitaxial layer;
   a fourth well region of the first conductivity type formed in the first epitaxial layer spaced apart from the ninth doped region; and
   a tenth doped region of the first conductivity type formed in the fourth well,
   wherein the ninth doped region, the first epitaxial layer, the fourth well and the tenth doped region form the PN junction diode.

15. The TVS device of claim 14, wherein the fourth well region has a doping level different from the doping level of the fourth doped region.

16. The TVS device of claim 1, wherein the high-side steering diode comprises:
   a plurality of PN junction diodes connected in series, a first PN junction diode of the plurality of PN junction diodes having an anode terminal coupled to the first protected node and a cathode terminal coupled to the next PN junction diode in the series, and a last PN junction diode of the plurality of PN junction diodes having an anode terminal coupled to the cathode terminal of a previous PN junction diode in the series and a cathode terminal.

17. The TVS device of claim 1, wherein the high-side steering diode comprises a punch-through silicon controlled rectifier, the punch-through silicon controlled rectifier including alternating p-type and n-type regions where the n-type region between a pair of p-type regions is substantially depleted at a bias voltage of zero volt.

18. The TVS device of claim 1, wherein a portion of the first epitaxial layer between the first doped region and the first well is depleted at a bias voltage of zero volt.

19. The TVS device of claim 1, wherein the first conductivity type comprises N-type conductivity and the second conductivity type comprises P-type conductivity.

20. The TVS device of claim 2, wherein the isolation structures comprises a plurality of trench isolation structures isolating the active regions, each trench isolation structures extending from the first epitaxial layer to the second epitaxial layer.

* * * * *